(12) United States Patent
Peeters Weem

(10) Patent No.: US 10,079,639 B2
(45) Date of Patent: Sep. 18, 2018

(54) MULTIPLE TIMEBASE SAMPLING SCOPE

(71) Applicant: Tektronix, Inc., Beaverton, OR (US)

(72) Inventor: Jan P. Peeters Weem, Forest Grove, OR (US)

(73) Assignee: Tektronix, Inc., Beaverton, OR (US)

(*) Notice: Subject to any disclaimer, the term of this patent is extended or adjusted under 35 U.S.C. 154(b) by 0 days.

(21) Appl. No.: 15/167,550

(22) Filed: May 27, 2016

(65) Prior Publication Data

US 2017/0346555 A1 Nov. 30, 2017

(51) Int. Cl.
*H04B 10/077* (2013.01)
*H03L 7/08* (2006.01)
*H04J 3/06* (2006.01)
*H04J 14/08* (2006.01)
*H04L 7/00* (2006.01)
*G01R 13/02* (2006.01)

(52) U.S. Cl.
CPC ..... *H04B 10/0775* (2013.01); *G01R 13/0236* (2013.01); *H03L 7/0807* (2013.01); *H04J 3/06* (2013.01); *H04J 14/08* (2013.01); *H04L 7/0087* (2013.01)

(58) Field of Classification Search
CPC ............ H04B 10/299; H04B 10/07951; H04B 10/532; H04B 10/614; H04B 10/07953; H04B 10/2569; H04B 10/2572; H04B 10/612; H04B 10/0775
USPC ........ 375/224, 228, 280, 298, 306–307, 330
See application file for complete search history.

(56) References Cited

U.S. PATENT DOCUMENTS

| | | | |
|---|---|---|---|
| 7,363,563 B1* | 4/2008 | Hissen | H04L 1/243 327/144 |
| 2003/0161638 A1* | 8/2003 | Fujiwara | G02F 1/0136 398/184 |
| 2007/0038999 A1* | 2/2007 | Millington | H04J 3/0664 718/100 |
| 2007/0086787 A1* | 4/2007 | Cho | H04B 10/505 398/183 |
| 2009/0074030 A1* | 3/2009 | Agoston | H04B 15/02 375/130 |
| 2014/0185125 A1* | 7/2014 | Kanter | G02F 1/21 359/279 |
| 2016/0253077 A1* | 9/2016 | Kellner | G06F 3/04847 715/788 |

* cited by examiner

*Primary Examiner* — Emmanuel Bayard
(74) *Attorney, Agent, or Firm* — Miller Nash Graham & Dunn; Kevin D. Dothager

(57) ABSTRACT

A test and measurement instrument includes a first input port and a second input port that receive a first input signal modulated according to a first clock signal and a second input signal modulated according to a second clock signal, respectively. The first clock signal and the second clock signal may be asynchronous. The instrument also includes a phase reference that generates clock data for the second clock signal. The instrument includes a processor that determines time bases for the input signals that comprise different rates based on the received and/or generated clock data. The instrument also includes a display coupled to the processor. The display concurrently displays the first input signal in a first graticule according to the first time base and the second input signal in a second graticule according to the second time base.

15 Claims, 7 Drawing Sheets

MULTIPLE TIMEBASE SAMPLING SCOPE

CROSS-REFERENCES TO RELATED APPLICATIONS

None.

FIELD OF THE INVENTION

This disclosure is directed to a system and methods for oscilloscope operation, and, more particularly, to a system and methods for simultaneously displaying a plurality of signals with a plurality of time bases on an oscilloscope.

BACKGROUND

An oscilloscope is an electronic test instrument that receives an input signal and displays the input signal as function of time. An oscilloscope receives a clock signal associated with the input signal and determines a time base for the signal. The oscilloscope then samples the input signal according to the time base to determine a waveform shape for the input signal over time. The input signal is then displayed according to the time base. The oscilloscope may also employ various transforms to convert portions of the signal into a frequency domain for display. Advanced oscilloscopes may even receive a plurality of input signals and display such signals on the same screen for comparison.

But there are shortcomings with the conventional systems. For example, a traditional oscilloscope employs a single time base generated based on a single incoming clock signal. Accordingly, a traditional oscilloscope is limited to displaying synchronous signals. Specifically, all incoming signals must be modulated based on a single clock signal and are then displayed according to a common time base. As such, a traditional oscilloscope is incapable of receiving and simultaneously displaying a plurality of asynchronous signals, where asynchronous signals are modulated according to different clock signals. Further, a traditional oscilloscope would be incapable of receiving and completely displaying all components of a multiplexed signal where the multiplexed signal comprises a plurality of multiplexed signal components each modulated according to varying clock signals.

Embodiments of the invention address these and other issues in the prior art.

SUMMARY OF THE DISCLOSURE

Embodiments of the disclosed subject matter include an oscilloscope configured to employ multiple time bases to allow simultaneous display of a plurality of signals modulated according to asynchronous clock signals. The oscilloscope includes a clock data recovery (CR) circuit and a phase reference circuit configured to analyze an input signal and to generate a corresponding clock signal. A time base is then generated for the input signal based on the generated clock signal. As such, a different time base is generated for each signal, allowing asynchronous signals to be displayed concurrently. In some embodiments, all signal time bases are generated, allowing the user to provide signals without providing a clock signal. In some embodiments, multiplexed optical or electrical signals are divided into individual input signals so that each signal is displayed concurrently in a corresponding graticule according to a corresponding time base. Further, time bases for each signal can vary based on measurement type, for example a first signal can be displayed in units of radians while another signal is displayed in units of seconds, etc.

Accordingly, in at least some embodiments a test and measurement instrument includes a first input port that receives a first input signal modulated according to a first clock signal. The instrument also includes a second input port that receives a second input signal modulated according to a second clock signal. The first clock signal and the second clock signal are asynchronous. The instrument also includes a phase reference circuit coupled to the second input port. The phase reference circuit generates clock data for the second clock signal. The instrument also includes a processor that determines a first time base for the first input signal and a second time base for the second input signal based on the received and/or generated clock data. The first time base and the second time base comprise different rates. The instrument also includes a display coupled to the processor. The display concurrently displays the first input signal in a first graticule according to the first time base and the second input signal in a second graticule according to the second time base.

In another aspect, in at least some embodiments a method is implemented in a test and measurement instrument, the method including receiving a first input signal modulated according to a first clock signal and second input signal modulated according to a second clock signal, respectively, such that the first clock signal and the second clock signal are asynchronous. A phase reference circuit is employed to generate clock data corresponding to the second clock signal. A processor is employed to determine a first time base for the first input signal and a second time base for the second input signal based on the generated clock data, such that the first time base and the second time base comprise different rates. A display is employed to display the first input signal in a first graticule according to the first time base and the second input signal in a second graticule according to the second time base, respectively.

In yet another aspect, in at least some embodiments a non-transitory computer readable medium stores a computer program for execution by a processor configured to perform test and measurement, the computer program causing the processor to perform a method comprising receiving a first input signal modulated according to a first clock signal and second input signal modulated according to a second clock signal, respectively, such that the first clock signal and the second clock signal are asynchronous. A phase reference circuit is employed to generate clock data corresponding to the second clock signal. A processor is employed to determine a first time base for the first input signal and a second time base for the second input signal based on the generated clock data, such that the first time base and the second time base comprise different rates. A display is employed to display the first input signal in a first graticule according to the first time base and the second input signal in a second graticule according to the second time base, respectively.

DETAILED DESCRIPTION

As described herein, the embodiments of the disclosure are directed to a test and measurement instrument (e.g. an oscilloscope) configured to employ multiple time bases to allow simultaneous display of a plurality of signals modulated according to asynchronous clock signals. The oscilloscope includes a CR circuit and a phase reference circuit configured analyze an input signal to generate a corresponding clock signal. A time base is then generated for the input signal based on the generated clock signal. As such, a different time base is generated for each signal, allowing asynchronous signals to be displayed concurrently. In some embodiments, all signal time bases are generated, allowing the user to provide signals without providing a clock signal. In some embodiments, multiplexed optical signals are divided into individual input signals so that each signal is displayed concurrently in a corresponding graticule according to a corresponding time base. Further, time bases for each signal can vary based on measurement type, for example a first signal can be displayed in units of radians while another signal is displayed in units of seconds, etc.

By employing the abovementioned embodiments, a plurality of input signals, modulated according to asynchronous clock signals, are displayed simultaneously by causing each input signal to be displayed according to its own time base. Further, generating the clock data directly from the signal(s) frees the user from the requirement of providing a separate clock signal for each input signal and, in some embodiments, frees the user from being required to provide any clock signal for any input. As such, by employing the abovementioned embodiments, the resulting oscilloscope offers increased functionality and reduces the requirements on the end user.

The term asynchronous as used in this application means two or more signals that are not synchronized according to a common clock signal, such that modulations of the signals vary independently with respect to time.

The term time base as used in this application means a function provided by a function generator that generates a waveform across a display as a function of time.

The term multiplex signal as used in this application means a plurality of independently modulated signals combined into a single signal for transmission across a common channel or medium.

Figure 1:
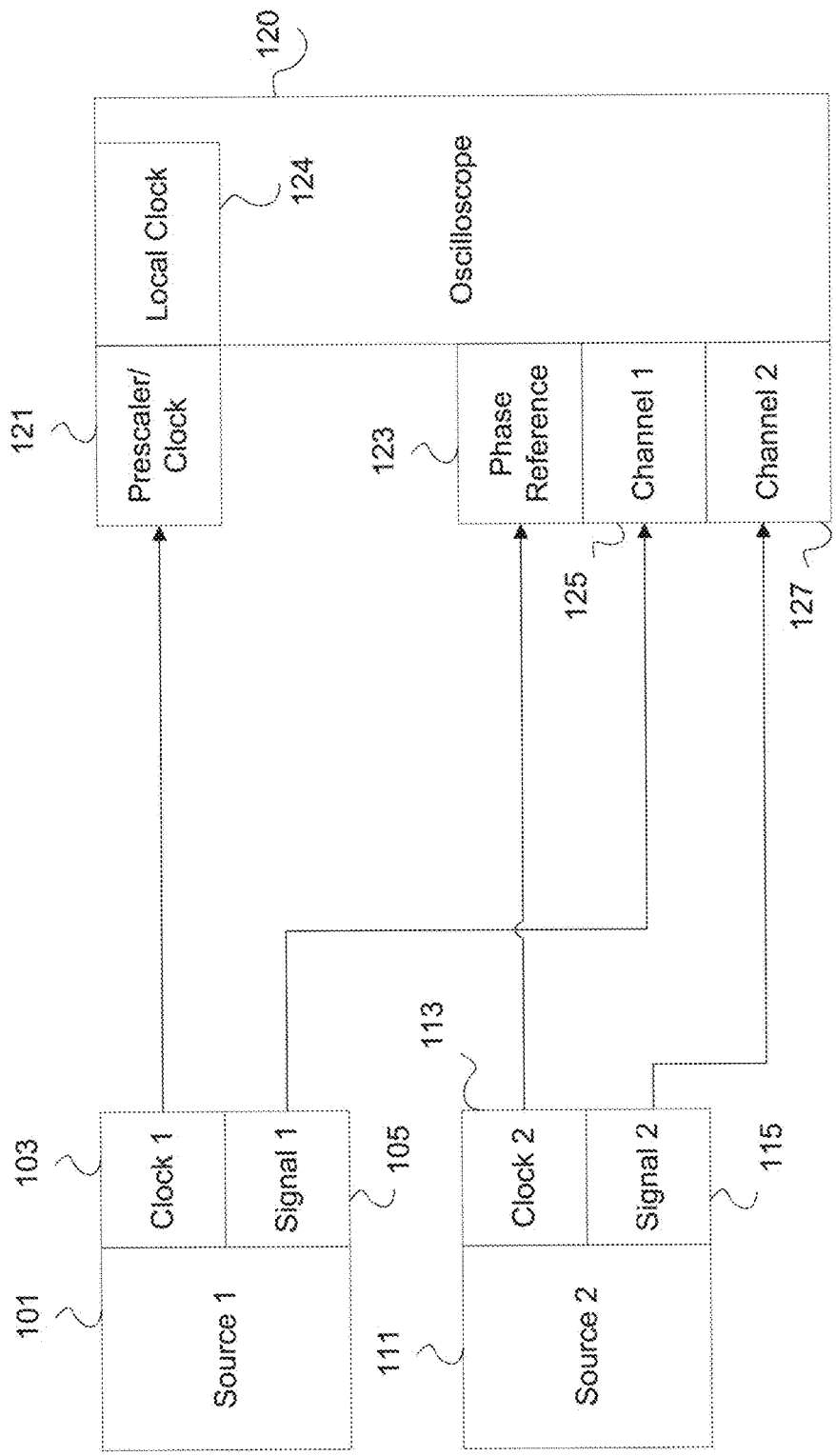
FIG. 1 is a schematic diagram of an embodiment of an oscilloscope configured to accept a plurality of asynchronous input signals.

FIG. 1 is a schematic diagram of an embodiment of an oscilloscope 120 configured to accept a plurality of asynchronous input signals 105 and 115. Sources 101 and 111 may be any signal sources configured to transmit an electrical and/or optical signal. For example, sources 101 and 111 may comprise any form of electrical or optical transmitter. Sources 101 and 111 transmit input signals 105 and 115, respectively, which are each modulated according to a clock or clock signal indicated by clock signal 103 and clock signal 113, respectively. Accordingly, clock signals 103 and 113 are signals that indicate modulation timings of input signals 105 and 115, respectively. Input signals 105 and 115 may be electrical or optical and may be modulated with information in digital or analog form. Clock signals 105 and 115 are representations of local clock times used at sources 101 and 111 respectively.

The oscilloscope 120 is a test and measurement instrument configured to receive and display each input signal on a graticule according to a time base determined based on the corresponding clock signal. Specifically, the oscilloscope 120 comprises at least a prescaler/clock input 121, a phase reference input 123, and channel inputs 125 and 127. As shown, channel input 125 and channel input 127 receive input signals 105 and 115, respectively, which are analyzed by the oscilloscope 120 for display on corresponding graticules as discussed in more detail below. Prescaler/clock input 121 receives clock signal 103. Prescaler/clock input 121 is coupled to a prescaler circuit in the oscilloscope 120. A prescaler circuit is an electronic counter circuit that receives a high frequency signal and lowers the frequency as needed by interger division prior to forwarding the signal to a local clock 124. Local clock 124 is any clock circuit configured to keep time on oscilloscope 120. Accordingly, prescaler/clock input 121 receives clock signal 103 for calculation of a first time base, which is then employed to determine when to sample input signal 105. The resulting samples of input signal 105, received via channel 125, are then compiled to graph a corresponding image displayed on a corresponding graticule.

Clock signal 113 may be assumed to be asynchronous from clock signal 103. Accordingly, a second time base is determined for signal 115 by employing clock signal 113. Oscilloscope 120 may be limited to a single clock circuit, which is employed for sampling signal 105 based on clock signal 103. Accordingly, clock signal 113 is received at the phase reference input 123. Phase reference input 123 is an input coupled to a phase reference circuit comprising a plurality of samplers. The phase reference circuit samples Inphase (I) and Quadrature (Q) components of the clock signal 113 for analyzing a lissajous curve of the clock signal 113, for example by employing a processor. The lissajous curve of the clock signal 113 is compared to timing data from the local clock circuit, for example by the processor, to generate a second time base corresponding to input signal 115. By employing the second time base, input signal 115 can be sampled and displayed on a second graticule without employing the prescaler/clock input 121. Accordingly, asynchronous input signals 105 and 115 can each be displayed (e.g. as an eye diagram) according to separate time bases while only employing a single local clock 124 circuit at the oscilloscope 120.

Figure 2:
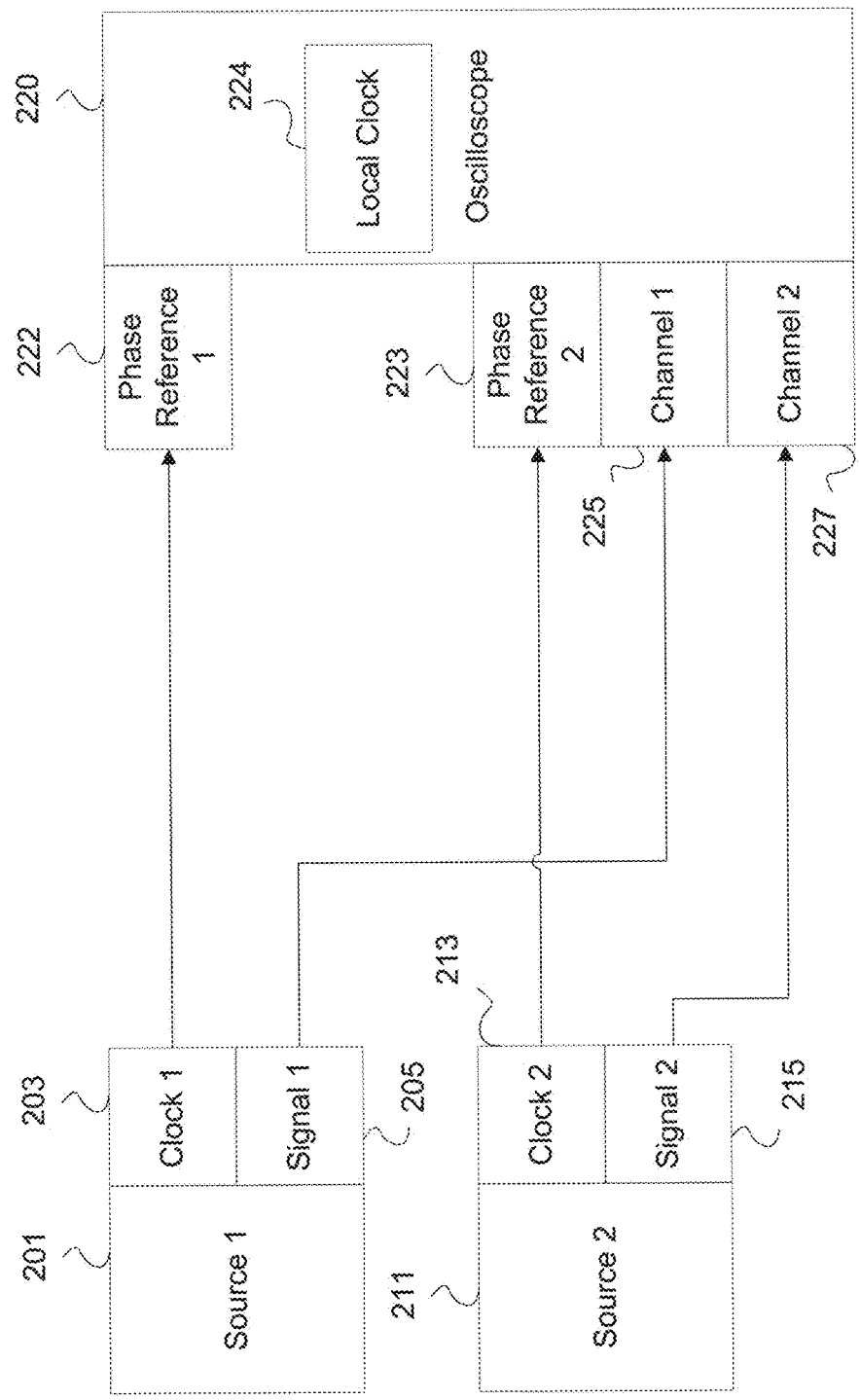
FIG. 2 is a schematic diagram of another embodiment of an oscilloscope configured to accept a plurality of asynchronous input signals.

FIG. 2 is a schematic diagram of another embodiment of an oscilloscope 220 configured to accept a plurality of asynchronous input signals. Oscilloscope 220 is substantially similar to oscilloscope 120, but is configured to receive clock signals without routing any of them directly to a clock circuit via a prescaler/clock input, such as prescaler/clock input 121. Source 201 comprises clock signal 203 and input signal 205, which are substantially similar to sources 101, clock signal 103, and input signal 105, respectively. Source 211 comprises clock signal 213 and input signal 215, which are substantially similar to sources 111, clock signal 113, and input signal 115, respectively. Oscilloscope 220 comprises channel inputs 225 and 227, which are substantially similar to channel inputs 125 and 127, respectively, and receive input signals 205 and 215, respectively. Oscilloscope also comprises local clock 224, which is substantially similar to local clock 124. Oscilloscope 220 further comprises phase reference inputs 222 and 223, which are substantially similar to phase reference input 123. Phase reference inputs 222 and 223 each comprise a plurality of samplers and are each configured to sample I and Q components of clock signals 203 and 213, respectively. Phase reference inputs 222 and 223 then analyze lissajous curves for their corresponding clock signals. A processor then compares the lissajous curves with clock data from the local clock circuit 224, allowing a first time base to be generated from clock signal 203 and a second time base to be generated from clock signal 213 without routing any clock signal data directly to the local clock circuit. As such, the number of time bases that can be supported by oscilloscope 220 is equal to the available number of phase reference inputs. If one of the clock signals is routed to a prescaler/clock input, the number of time bases that could be supported is one plus the number of phase reference inputs. As such, each input signal (e.g. input signals 205 and 215) can be displayed (e.g. as an eye diagram on a graticule) according to a separate time base, which allows asynchronous input signals to be simultaneously displayed by oscilloscope 220.

Figure 3:
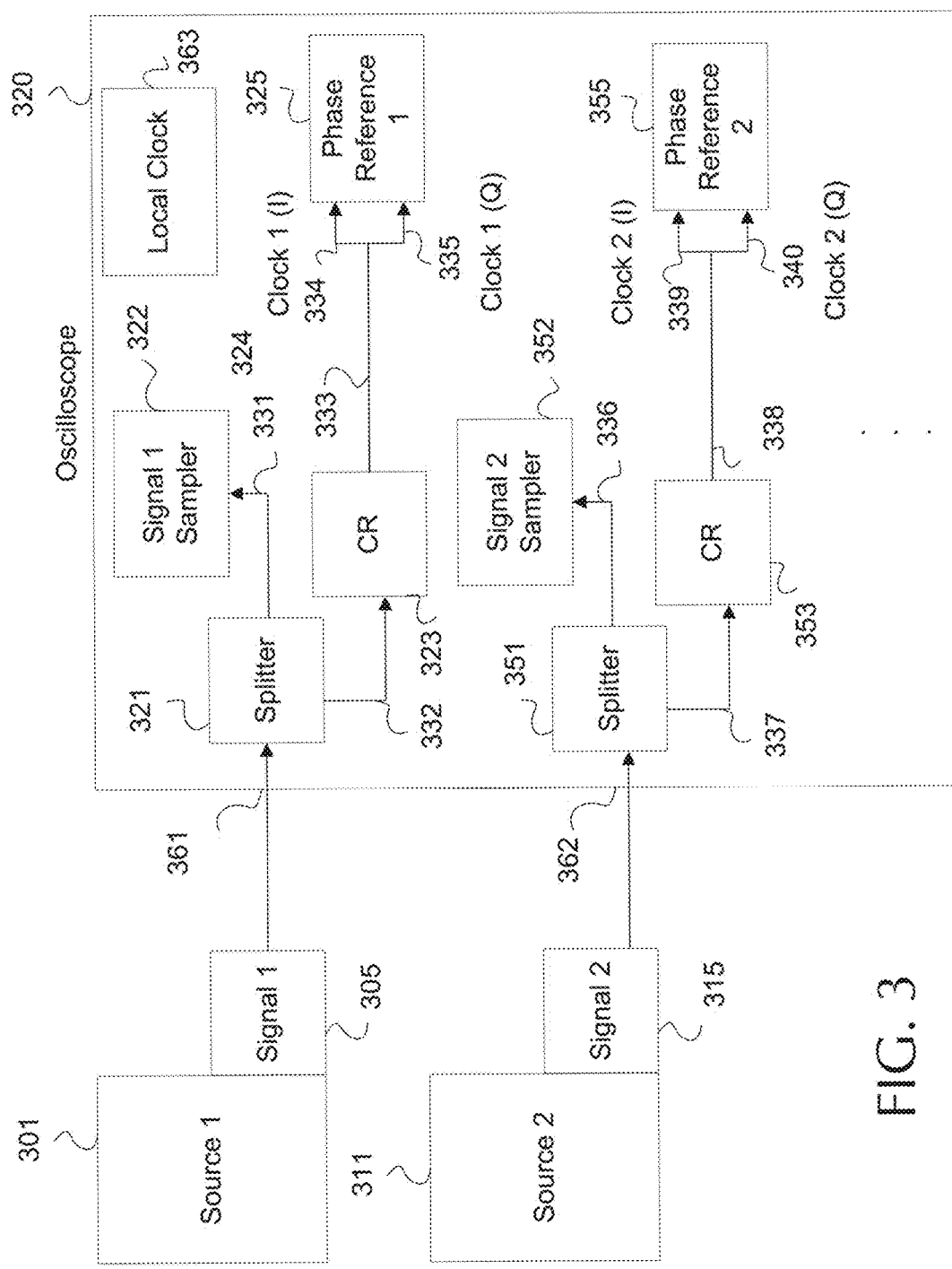
FIG. 3 is a schematic diagram of an embodiment of another oscilloscope configured to accept a plurality of asynchronous input signals without receiving any clock signals.

FIG. 3 is a schematic diagram of an embodiment of another oscilloscope 320 configured to accept a plurality of asynchronous input signals without receiving any clock signals. Sources 301 and 311 are substantially similar to sources 101 and 111 respectively. Sources 301 and 311 transmit input signals 305 and 315, respectively, which are substantially similar to input signals 105 and 115, respectively. Unlike sources 101 and 111, sources 301 and 311 are not required to provide clock signals to oscilloscope 320. Accordingly, oscilloscope 320 requires fewer user input signals, making oscilloscope 320 more user friendly than some oscilloscope embodiments.

Oscilloscope 320 comprises an input port 361 for receiving input signal 305, which may be similar to a phase reference input 123, and/or 222, 223. Oscilloscope 320 further comprises splitter 321, for splitting incoming input signal 305 into input signals 331-332. In embodiments where input signal 305 is an electrical signal, splitter 321 may comprise amplifiers to accommodate for loss of signal strength occurring when the signal 305 is split into signals 331-332. In embodiments where input signal 305 is an optical signal, splitter 321 also comprises an optical receiver that converts the optical signal into the electrical domain. For example, splitter 321 may comprise a optical receiver such as a (PIN Photo Diode), and may also comprise amplifier(s), etc. Splitter 321 forwards the split input signal 331-332 to a signal sampler 322 and a clock data recovery (CR) circuit 323, respectively.

Signal sampler 322 is any device configured to take samples of a continuous input signal waveform in order to convert the continuous signal into a discrete signal for signal processing purposes. Signal sampler 322 receives a first portion of the split input signal 331 for processing and display on a graticule. A second portion of the split input signal 332 is forwarded to the CR 323 to support determining a time base for the first portion of the split signal 331.

CR 323 is any circuit configured to generate a clock signal/clock data from a frequency reference, for example as part of a phased-locked loop. For example, CR 323 regenerates a clock signal from the second portion of the split signal 332 at the full data rate or a fraction of the data rate of the input signal 305. The resulting clock data 333 is then split into an I portion 334 and a Q portion 335, which are forwarded to a phase reference 325. Phase reference 325 comprises a plurality of samplers, which sample the I portion 334 and the Q portion 335 to obtain the time information needed to analyze lissajous curves associated with the input signal 305. The time information is then forwarded to a processor for comparison with data from a local clock circuit 363, resulting in the generation of a first time base that corresponds to the first portion of the split input signal 331. As such, the split input signal 331 can be plotted without receiving a clock signal from the source 301.

Oscilloscope 320 comprises input port 362, splitter 351, signal sampler 352, CR 353, and phase reference 355, which are substantially similar to splitter 321, signal sampler 322, CR 323, and phase reference 325, respectively. Specifically, splitter 351 splits input signal 315 into a first portion 336 for sampling and a second portion 337 for generation of a time base. The second portion 337 is forwarded to the CR 353 for conversion into clock data 338, split into an I portion 339 and a Q portion 340, and forwarded to phase reference 355 for lissajous analysis. Accordingly, a second time base for input signal 315 is generated in a manner similar to the first time base. The circuit comprising a splitter, sampler, CR, and phase reference can be repeated as many times as desired in order to generate a corresponding number of time bases for a corresponding number of input signals. As such, any number of asynchronous input signals can be analyzed according to separate time bases and displayed to corresponding graticules. Further, oscilloscope 320 can be used without requiring an explicit clock signal from the source, which increases ease of use and flexibility for the user as the user is not required to obtain a clock signal prior to using oscilloscope 320.

Figure 4:
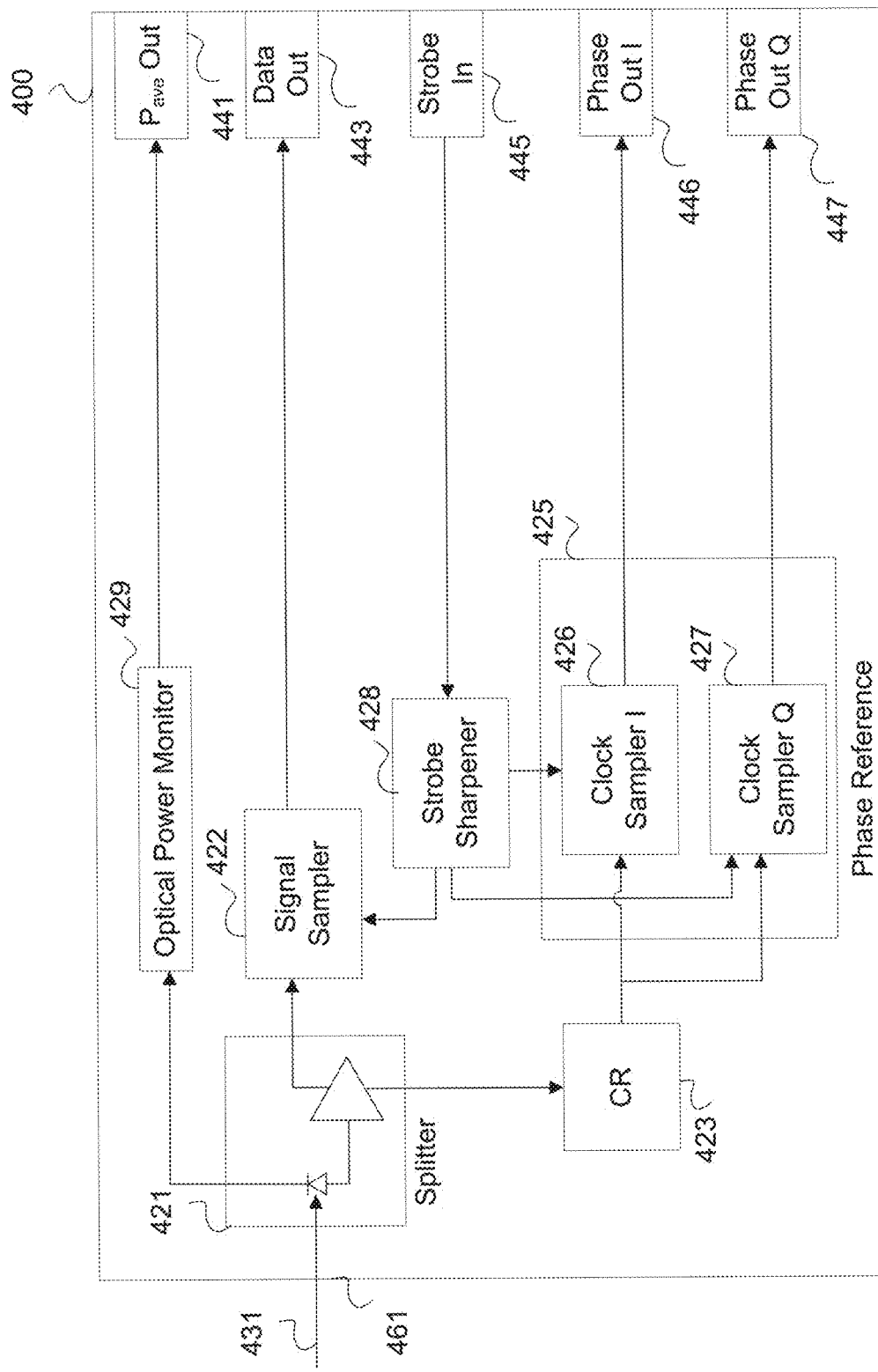
FIG. 4 is a schematic diagram of an embodiment of a signal analysis circuit configured to generate a time base from an input signal.

FIG. 4 is a schematic diagram of an embodiment of a signal analysis circuit 400 configured to generate a time base from an input signal 431. Signal analysis circuit 400 is a specific implementation of a circuit for use in an oscilloscope, such as oscilloscope 320, to generate a time base for a signal. Accordingly, any number of signal analysis circuits 400 can be employed to support generation of a corresponding number of time bases for a corresponding number of asynchronous input signals. While signal analysis circuit 400 is configured to receive optical input signals, it should be noted that signal analysis circuit 400 could be configured to operate on electrical inputs by removing the optical power monitor 429 and Pave out 441 and reconfiguring the splitter 421 for electrical signals.

In an embodiment, input signal 431 is an optical signal that is received directly from a source via input port 461. Alternatively, a source may provide a plurality of multiplexed signals on a single input, in which case the multiplexed signals are split between a plurality of signal analysis circuits 400 by employing an optical splitter. In such a case, input signal 431 is one portion of a received multiplexed optical signal. Input signal 431 is forwarded to splitter 421, which may be substantially similar to splitter 321 in some embodiments. As shown, splitter 421 comprises a photo diode to convert the optical signal into the electrical domain and an amplifier to boost the electrical signal for further sampling. A portion of the converted input signal 431 is then forwarded to signal sampler 422 and another portion is forwarded to CR 423. Additionally, a bias voltage from the photo diode may be forwarded to an optical power monitor 429, which can be any device configured to monitor power from an incoming optical signal. Optical power data is then forwarded to an average power (Pave) output 441 to allow a user to monitor the signal strength of the incoming optical input signal 431.

Signal sampler 422 receives and samples the input signal in the electrical domain in a manner substantially similar to signal sampler 322. Data out 443 is coupled to a processor, allowing the discrete signal data to be plotted to a display according to a time base determined by the CR 423 and accompanying circuits.

CR 423 is substantially similar to CR 353. CR 423 receives a portion of the input signal 431, as converted into the electrical domain, and generates the clock signal from the input signal 431 at the full data rate or a fraction of the data rate. The generated clock signal is forwarded to phase reference 425. Phase reference 425 is substantially similar to phase reference 325. Phase reference 425 comprises clock samplers 426-427, which sampler the I and Q components of the generated clock signal based on user input via the strobe sharpener 428. Clock samplers 426-427 are substantially similar to signal sampler 422, but are dedicated for sampling generated clock signals. The sampled I component of the generated clock signal is forwarded to phase output I 446 and the sampled Q component of the generated clock signal is forwarded to phase output Q 447, respectively. Accordingly, a processor can receive the I and Q components from phase output I 446 and phase output Q 447, analyze lissajous curves for the generated clock signal based on the measured I and Q components, and reference the local clock to generate a time base for the input signal 431. The sampled and amplified portion of the input signal is also received by the processor via data out 443, allowing the sampled and amplified portion of the input signal to be plotted on a display based on the time base calculated from I phase out phase output I 446 and phase output Q 447. As such, a plurality of signal analysis circuits 400 can be employed in a single oscilloscope to display a plurality of asynchronous signals, each according to its own time base.

Figure 5:
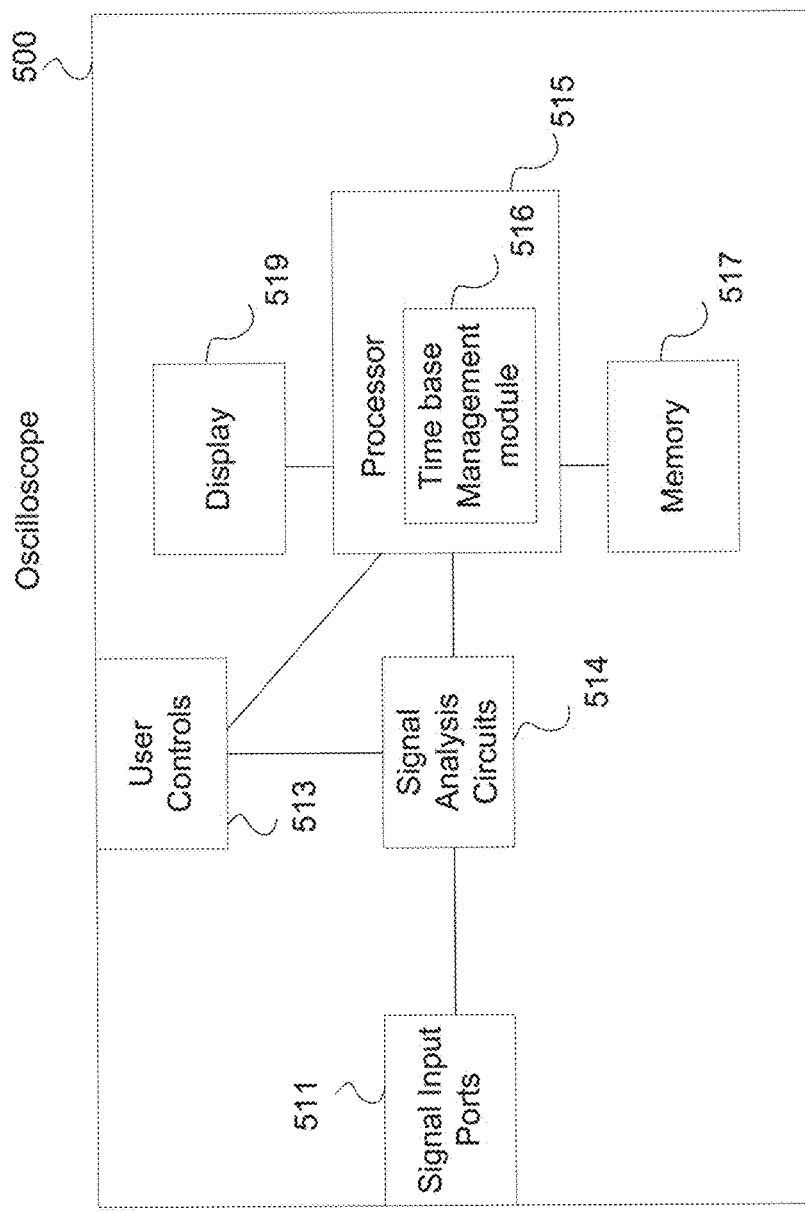
FIG. 5 is a schematic diagram of an embodiment of an oscilloscope configured to accept a plurality of asynchronous input signals and display them to a user.

FIG. 5 is a schematic diagram of an embodiment of an oscilloscope 500 configured to accept a plurality of asynchronous input signals and display them to a user. Oscilloscope 500 may be employed to implement and/or operate in conjunction with oscilloscope 120, 220, 320, signal analysis circuit 400, and/or display 700. Oscilloscope 500 may also be configured to implement method 600 and/or any other method disclosed herein. Oscilloscope 500 comprises signal input ports 511 which may be any electrical and/or optical ports, receivers, etc. configured to accept an input signal for testing purposes. Signal input ports 511 may comprise channel inputs, phase reference inputs, clock inputs, and/or any other signal input. Signal input ports 511 are coupled to signal analysis circuits 514, which may comprise samplers, phase reference circuits, CRs, and/or any components discussed with respect to signal analysis circuit 400. Signal analysis circuits 514 receive input signals from the signal input ports 511, perform sampling and other signal analysis on the input signals, and perform clock signal generation and associated I and Q sampling. Signal analysis circuits 514 are implemented as an application specific integrated circuit (ASIC) a digital signal processor (DSP), or other processing circuitry. Signal analysis circuits 514 are coupled to processor 515, which may be implemented as a general purpose processor. Processor 515 is configured to execute instructions from memory 517 and perform any methods and/or associated steps indicated by the instructions. Memory 517 may be implemented as processor cache, random access memory (RAM), read only memory (ROM), solid state memory, hard disk drive(s), or any other memory type. Memory 517 acts as a non-transitory medium for storing computer program products and other instructions and providing such products/instruction to the processor 515 for computation as needed.

Processor 515 may comprise a time base management module 516. The time base management module 516 is processing circuit and/or set of instructions configured to accept sampled signals from the signal analysis circuits 514, generate signal plots according to discrete signal samples, generate time bases for input signals, control the display 519 to cause the input signals to be displayed according to the time bases, and/or perform any other methods discussed herein. In some embodiments, the time base management module 516 may also be implemented, in whole or in part, in the memory 517, processor 515, signal analysis circuits 514, and/or display 519.

User controls 513 are coupled to the processor 515 and signal analysis circuits 514. User controls 513 may comprise strobe inputs, gain controls, triggers, display adjustments, power controls, or any other controls employable by a user to display or alter a display of an input signal on display 419. Display 419 may be a digital screen or a cathode ray tube based display. Display 419 comprises a plurality of graticules for displaying corresponding input signals, for example as eye diagrams. Accordingly, oscilloscope 500 may receive a plurality of asynchronous input signals via signal input ports 511, analyze/sample the signals and generate corresponding clock signals at the signal analysis circuits 514, generate time bases for the signals by analyzing lissajous curves at the processor 515, and/or displaying the signals on graticules on the display 519 according to the generated times bases by referencing a local clock (e.g. such as local clock 124, 224, or 363), but without forwarding at least some of the incoming clock signals to the clock and/or an associated prescaler.

Figure 6:
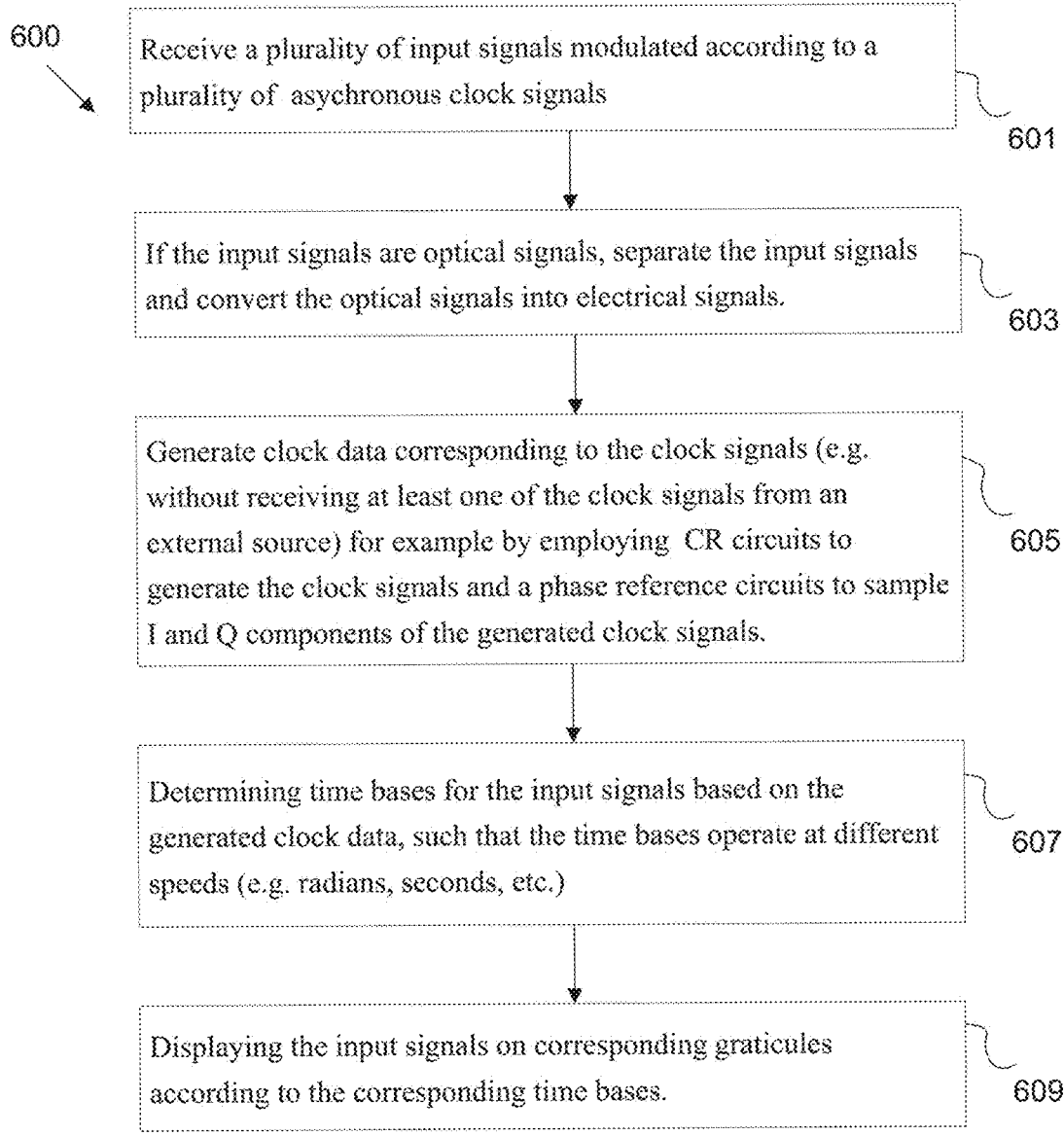
FIG. 6 is a flowchart of an embodiment of a method of displaying a plurality of asynchronous input signals to a user.

FIG. 6 is a flowchart of an embodiment of a method 600 of displaying a plurality of asynchronous input signals to a user. Method 600 may be implemented by oscilloscope 120, 220, 320, 500, signal analysis circuit 400, and/or any combination thereof. Method 600 initiates when a plurality of input signals are received at an oscilloscope at step 601. At least some of the input signals are modulated according to asynchronous clocks. The input signals may or may not be accompanied by corresponding clock signals. If the input signals are optical signals, the signals are separated and converted into electrical signals at step 603, for example by one or more optical splitters, diodes, photodetectors, etc. If the input signals electrical signals, they are received separately via a plurality of ports and step 603 is skipped. At step 605, clock data corresponding to the clock signals used to modulate the input signals are generated. In some embodiments, at least one clock signal is received at a phase reference and I and Q components are sampled to generate the clock data. In other embodiments, no clock signals are received from any external source and a CR is employed to generate the clock signals, which are then sampled (e.g. the I and Q components) at the phase reference. At step 607, a time base for each input signal is determined based on the clock data generated at step 605, for example by analyzing a lissajous curve for each clock signal. The time bases may comprise different rates. In other words, the time bases may be measured according to different units of measurements. For example, a first time base could use an angular based time base such as radians while a second time base could use a temporal measurement such as second or sub-units thereof (e.g. pico-seconds, micro-seconds, etc.) The time bases may be calculated by a processor in reference to a local clock without forwarding at least some of the clock signals directly to the local clock. At step 609, the input signals are sampled, plotted, and displayed on corresponding graticules according to the corresponding time bases calculated at step 607.

Figure 7:
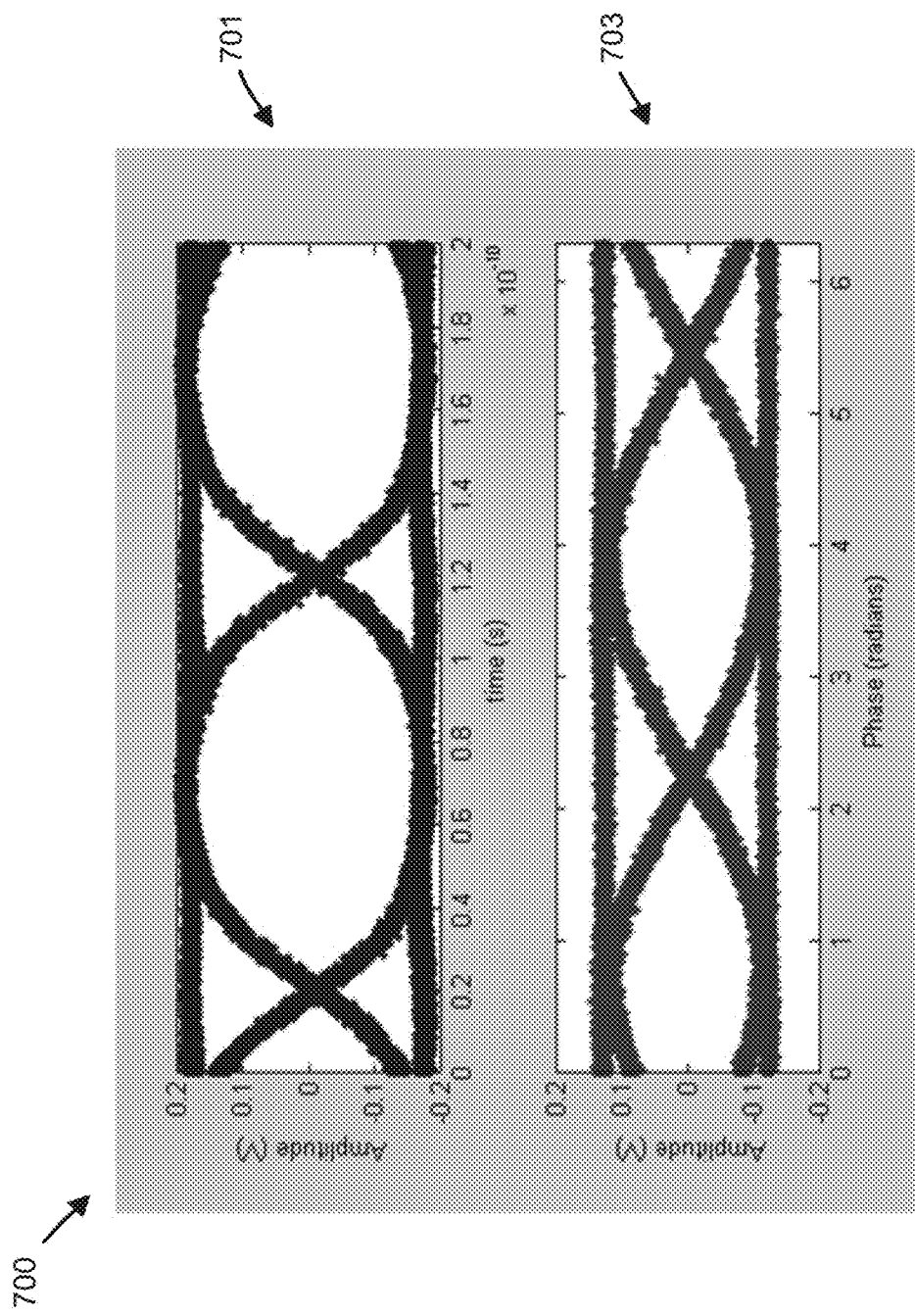
FIG. 7 illustrates an embodiment of a display with graticules displaying input signals according to different time bases.

FIG. 7 illustrates an embodiment of a display 700 with graticules displaying input signals according to different time bases. Display 700 may be employed in conjunction with oscilloscope 100, 200, 300, 500, and/or signal analysis circuit 400. Display 700 comprises a first graticule 701 configured to display a first signal, such as input signals 105, 205, 305, and/or 431, according to a first time base selected according to a clock signal corresponding to the first input signal. The first graticule 701 displays an eye diagram of the first input signal, depicted in black lines. The first input signal is shown varying as a function of voltage over time. Specifically, the first input signal in this example varies between −0.2 volts (V) and 0.2V. The first time base corresponding to the first input signal is shown across the horizontal axis in units of time, specifically in units of $1\times10^{-10}$ seconds (e.g. $\frac{1}{10}$ of a nanosecond). Other temporal time bases may also be used such as seconds, milliseconds, microseconds, picoseconds, femtoseconds, attoseconds, etc.

Display 700 further comprises a second graticule 703 configured to display a second signal, such as input signals 115, 215, 315, and/or 431, according to a second time base selected according to a clock signal corresponding to the second input signal. The first graticule 701 displays an eye diagram of the first input signal, depicted in black lines. The second input signal is shown varying as a function of voltage over phase. Specifically, the first input signal in this example varies between about −0.1 V and 0.1V. The second time base corresponding to the second input signal is shown across the horizontal axis in units of phase, specifically in units of radians. Other angular time bases may also be used such as degrees, etc. By employing display 700, two concurrently sampled signals can be displayed according to different time bases. It should be noted that any number of graticules may be employed and therefore any number of input signals can displayed according to any number of time bases (e.g. three time bases, four time bases, five time bases, etc.). As such display 700 is presented as an example for purposes of discussion and should not be considered limiting. It should also be noted that any combination of time bases may be employed, for example multiple temporal time bases of different granularity (e.g. seconds and picoseconds), multiple angular time bases (e.g. radians and degrees), or combinations thereof.

Embodiments of the invention may operate on a particularly created hardware, on firmware, digital signal processors, or on a specially programmed general purpose computer including a processor operating according to programmed instructions. The terms "controller" or "processor" as used herein are intended to include microprocessors, microcomputers, ASICs, and dedicated hardware controllers. One or more aspects of the invention may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, RAM, etc. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like. Particular data structures may be used to more effectively implement one or more aspects of the invention, and such data structures are contemplated within the scope of computer executable instructions and computer-usable data described herein.

The previously described versions of the disclosed subject matter have many advantages that were either described or would be apparent to a person of ordinary skill. Even so, all of these advantages or features are not required in all versions of the disclosed apparatus, systems, or methods.

Additionally, this written description makes reference to particular features. It is to be understood that the disclosure in this specification includes all possible combinations of those particular features. For example, where a particular feature is disclosed in the context of a particular aspect or embodiment, that feature can also be used, to the extent possible, in the context of other aspects and embodiments.

Also, when reference is made in this application to a method having two or more defined steps or operations, the defined steps or operations can be carried out in any order or simultaneously, unless the context excludes those possibilities.

Furthermore, the term "comprises" and its grammatical equivalents are used in this application to mean that other components, features, steps, processes, operations, etc. are optionally present. For example, an article "comprising" or "which comprises" components A, B, and C can contain only components A, B, and C, or it can contain components A, B, and C along with one or more other components.

Although specific embodiments of the invention have been illustrated and described for purposes of illustration, it will be understood that various modifications may be made without departing from the spirit and scope of the invention. Accordingly, the invention should not be limited except as by the appended claims.

The invention claimed is:

1. A test and measurement instrument, comprising:
a first input port configured to receive a first input signal modulated according to a first clock signal;
a second input port configured to receive a second input signal modulated according to a second clock signal, such that the first clock signal and the second clock signal are asynchronous;
a phase reference circuit coupled to the second input port and configured to generate clock data corresponding to the second clock signal;
a processor configured to:
determine a first time base for the first input signal; and
determine a second time base for the second input signal based on the generated clock data, such that the first time base and the second time base comprise different rates; and
a display coupled to the processor and configured to:
display the first input signal in a first graticule according to the first time base; and
display the second input signal in a second graticule according to the second time base.

2. The test and measurement instrument of claim 1, comprising at least two phase reference circuits such that each phase reference circuit generates clock data from a corresponding input signal and such that each input signal is displayed on a corresponding graticule according to the corresponding generated clock data without receiving the corresponding clock signal directly at a local clock circuit.

3. The test and measurement instrument of claim 1, wherein the first input signal and the second input signal are optical signals, wherein the first input port and the second input port are the same input port, and wherein the test and measurement instrument further comprises an optical splitter configured to separate the first input signal from the second input signal.

4. The test and measurement instrument of claim 1, further comprising a clock and data recovery (CR) circuit coupled to the second input port and the phase reference circuit, the CR circuit configured to generate the second clock signal from the second input signal without receiving the second clock signal from an external source.

5. The test and measurement instrument of claim 4, wherein the phase reference circuit is further configured to generate clock data corresponding to the second clock signal by sampling an Inphase (I) component and a Quadrature (Q) component of the generated second clock signal from the CR circuit.

6. The test and measurement instrument of claim 1, wherein the display is further configured to display at least two input signals of varying time bases without receiving any clock signals at the test and measurement instrument.

7. A method implemented in a test and measurement instrument, the method comprising:
    receiving a first input signal modulated according to a first clock signal;
    receiving a second input signal modulated according to a second clock signal, such that the first clock signal and the second clock signal are asynchronous;
    generating, by a phase reference circuit, clock data corresponding to the second clock signal;
    determining, by a processor, a first time base for the first input signal;
    determining, by the processor, a second time base for the second input signal based on the generated clock data, such that the first time base and the second time base comprise different rates;
    displaying, on a display, the first input signal in a first graticule according to the first time base; and
    displaying, on the display, the second input signal in a second graticule according to the second time base.

8. The method of claim 7, wherein each phase reference circuit generates clock data from a corresponding input signal such that each input signal is displayed on a corresponding graticule according to the corresponding generated clock data without receiving the corresponding clock signal directly at a local clock circuit.

9. The method of claim 7, wherein the first input signal and the second input signal are optical signals, and wherein the method further comprises separating the first input signal from the second input signal.

10. The method of claim 7, further comprising generating the second clock signal from the second input signal by employing a clock and data recovery (CR) circuit.

11. The method of claim 10, wherein generating clock data corresponding to the second clock signal comprises sampling an Inphase (I) component and a Quadrature (Q) component of the generated second clock signal from the CR circuit.

12. The method of claim 7, wherein the first input signal is displayed by employing an angular time base and the second input signal is displayed by employing a temporal time base.

13. A non-transitory computer readable medium having stored thereon a computer program product for execution by a processor configured to perform test and measurement, the computer program causing the processor to perform a method comprising:
    receiving a first input signal modulated according to a first clock signal;
    receiving a second input signal modulated according to a second clock signal, such that the first clock signal and the second clock signal are asynchronous;
    generating, by a phase reference circuit, clock data corresponding to the second clock signal;
    determining, by the processor, a first time base for the first input signal;
    determining, by the processor, a second time base for the second input signal based on the generated clock data, such that the first time base and the second time base comprise different rates;
    displaying, on a display, the first input signal in a first graticule according to the first time base; and
    displaying, on the display, the second input signal in a second graticule according to the second time base.

14. The computer readable medium of claim 13, wherein each phase reference circuit generates clock data from a corresponding input signal such that each input signal is displayed on a corresponding graticule according to the corresponding generated clock data without receiving the corresponding clock signal directly at a local clock circuit.

15. The computer readable medium of claim 13, wherein the first input signal and the second input signal are optical signals, and wherein the method further comprises separating the first input signal from the second input signal.

* * * * *